(12) United States Patent
Fujikawa et al.

(10) Patent No.: US 7,267,912 B2
(45) Date of Patent: Sep. 11, 2007

(54) EXPOSURE MASK AND PATTERN EXPOSURE METHOD

(75) Inventors: Tetsuya Fujikawa, Kawasaki (JP); Yoshinori Tanaka, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 492 days.

(21) Appl. No.: 10/795,788

(22) Filed: Mar. 8, 2004

(65) Prior Publication Data
US 2004/0248020 A1     Dec. 9, 2004

(30) Foreign Application Priority Data

Mar. 19, 2003  (JP)  .............. 2003-075304
Feb. 26, 2004  (JP)  .............. 2004-051596

(51) Int. Cl.
G03F 1/00   (2006.01)
G03C 5/00   (2006.01)

(52) U.S. Cl. .................. 430/5; 430/394

(58) Field of Classification Search ........... 430/5, 430/394; 716/19, 21
See application file for complete search history.

(56) References Cited

U.S. PATENT DOCUMENTS 5,638,156 A *  6/1997  Dehli ................. 355/72
5,656,526 A     8/1997  Inada et al. ............ 430/314
5,795,686 A     8/1998  Takizawa et al. ........ 430/5
5,945,256 A     8/1999  Kim et al. ............. 430/312

FOREIGN PATENT DOCUMENTS

| JP | 2-050130   | 2/1990  |
| JP | 6-324474   | 11/1994 |
| JP | WO95/16276 | 6/1995  |
| JP | 9-236930   | 9/1997  |
| JP | 11-174402  | 7/1999  |
| JP | 2002-139824 | 5/2007 |

* cited by examiner

Primary Examiner—S. Rosasco
(74) Attorney, Agent, or Firm—Greer, Burns & Crain, Ltd.

(57) ABSTRACT

An exposure mask which is capable of reducing non-uniformity in a display such as a liquid crystal display device. A first mask pattern having pattern-forming portions and shield portions mosaically arranged therein is formed in one end portion of an exposure mask, and a second mask pattern having pattern-forming portions and shield portions arranged in a manner complementary to the first mask pattern is formed at the other end portion of the exposure mask. The exposure mask is formed such that areas between vertically or laterally adjacent ones of the shield portions, in mosaic areas where pattern-forming portions and the shield portions are mosaically arranged, are also shielded.

4 Claims, 8 Drawing Sheets

EXPOSURE MASK AND PATTERN EXPOSURE METHOD

CROSS-REFERENCE TO RELATED APPLICATIONS

This application is based upon and claims the benefits of priority from the prior Japanese Patent Applications No. 2003-075304, filed on Mar. 19, 2003, and No. 2004-051596, filed on Feb. 26, 2004, the entire contents of which are incorporated herein by reference.

BACKGROUND OF THE INVENTION (1) Field of the Invention

This invention relates to an exposure mask and a pattern exposure method, and more particularly to an exposure mask for use in forming a pattern of wiring and pixel electrodes on a thin film transistor (TFT) substrate by step exposure, and a pattern exposure method for exposing the TFT substrate.

(2) Description of the Related Art

On a TFT substrate used in a liquid crystal display device, there are formed numerous TFTs corresponding in number to the number of pixels. FIG. 6 is a plan view showing an essential portion of a TFT substrate by way of example. The TFT substrate 100 shown in FIG. 6 is an active matrix substrate having pixels 101 arranged in matrix, and on the TFT substrate 100, each of the TFTs 102 formed for respective pixels 101 is connected to pixel electrodes 103 and wiring 104 including a gate bus line 104a and a drain bus line 104b. A whole pattern of pixel electrodes 103 and wiring 104 formed on such a TFT substrate includes lots of parts formed as repetitions of an identical pattern. Therefore, the pattern of pixel electrodes 103 and wiring 104 can be efficiently formed by step exposure in which an area containing a plurality of pixels 101 is exposed by one shot, and other areas having the same pattern as formed by the one shot are similarly repeatedly exposed.

However, in the case of forming a pattern on a TFT substrate by the step exposure described above, if positional deviation of an exposure area occurs during a shot, the deviation causes differences in the amount of exposure light and the position of exposure between pixels in a joint portion between patterns formed by the step exposure (hereinafter referred to as "step-exposure patterns") and the other pixels outside the joint portion. The difference in the amount of exposure light and the position of exposure shows up as deviation of dimensions of the wiring and the pixel electrodes from design dimensions, which causes difference in brightness between the formed pixels. As a result, on a liquid crystal display device using the TFT substrate, the joint portions of the step-exposure patterns appear as portions exhibiting display non-uniformity. As the size of a TFT substrate becomes larger, the step exposure produces a larger number of such joint portions. Therefore, it is crucially important to reduce the display non-uniformity.

Recently, a solution to this problem has been proposed in which the step exposure is performed using an exposure mask having a mask pattern formed such that shield portions corresponding to respective pixels are mosaically arranged in end portions of the mask pattern, so as to avoid occurrence of display non-uniformity (see e.g. Japanese Unexamined Patent Publication No. H09-236930).

FIGS. 7A and 7B are plan views schematically showing essential portions of a conventional exposure mask by way of example. FIG. 7A shows a mask pattern formed in a one-end portion of the exposure mask, and FIG. 7B shows a mask pattern formed in the other-end portion of the same. The right-side end of FIG. 7A corresponds to one end of the exposure mask, while the left-side end of FIG. 7B corresponds to the other end of the same. As shown in FIG. 7A, the mask pattern 110a formed in the one-end portion of the exposure mask has a mosaic arrangement of pattern-forming portions 111 each formed with traces to be exposed for one pixel and shield portions 112 each for blocking transmission of exposure light for one pixel. As shown in FIG. 7B, in the mask pattern 10b formed in the other-end portion of the exposure mask, the positional relationship between the pattern-forming portions 111 and the shield portions 112 is reverse to that in FIG. 7A. In short, the exposure mask has the mask patterns 110a and 110b formed in the respective opposite end portions in a manner complementary to each other.

FIG. 8 is a view useful in explaining the step exposure. In the step exposure carried out using the exposure mask shown in FIGS. 7A AND 7B, for example, respective end portions of step-exposure patterns 121 and 122 to be formed laterally adjacent to each other on a substrate 120 by respective shots are exposed in an overlapping manner (overlap exposure). The overlapping area is not only exposed through the mask pattern 110a, shown in FIG. 7A, in the one-end portion of the exposure mask by a shot I for forming the step-exposure pattern 121, but also exposed through the mask pattern 110b, shown in FIG. 7B, in the other-end portion by a shot II for forming the step-exposure pattern 122.

The conventional step exposure is carried out, as described above, by using the exposure mask having the mask patterns in the opposite end portions thereof formed in a manner complementary to each other, to thereby reduce display non-uniformity in the joint area where the step-exposure patterns overlap each other.

However, the conventional exposure mask suffers from the following several problems:

First, in the exposure mask having the shield portions each formed to have approximately the same size as the pattern-forming portion, when positional deviation occurs during step exposure, an area shielded during a preceding shot and an area shielded during the following shot often overlap each other to cause non-exposure in the area. To solve the problem, each shield portion is required to be formed to have a slightly smaller size than the pattern-forming portion. For this reason, the exposure mask has the shield portions each of which corresponds to one pixel and has a slightly smaller size than the pattern-forming portion, as shown in FIGS. 7A AND 7B. In this case, a gap is created between shield portions adjacent to each other.

The gap between each two of the adjacent shield portions allows exposure light to leak therethrough during step exposure.

An area to be shielded from exposure light by an adjacent shield portion during a following shot is an area exposed during the preceding shot. Therefore, if exposure light leaks through a gap between shield portions during the following shot, the area having already been exposed by the preceding shot is partially exposed again. Thus, in the step exposure carried out using the exposure mask described above, even when an exposure area is not positionally deviated, an area having already exposed can be overexposed by light leaked through a gap between shield portions. When traces, e.g. of a drain bus and pixel electrodes, to be formed near a border area between adjacent pixel areas are exposed once by a preceding shot and thereafter exposed again by the following shot, the line width of the traces can be made smaller than the design dimension. This brings about the difference in brightness between pixels and can be a cause of display non-uniformity of a liquid crystal display device. Variation in the line width of a pattern by overexposure is more conspicuous as the pattern formed on a TFT substrate is finer.

Further, the mosaic areas of the exposure mask for exposure of the joint area of step-exposure patterns cannot prevent occurrence of display non-uniformity only by laying out the pattern-forming portions and the shield portions in a simple mosaic arrangement. To realize an enhanced quality of images displayed by the liquid crystal display device, full consideration must be given to the layout of the mosaic areas.

SUMMARY OF THE INVENTION

The present invention has been made in view of the above described points, and an object thereof is to provide an exposure mask and a pattern exposure method which make it possible to prevent overexposure in step exposure to thereby form a TFT substrate capable of suppressing occurrence of display non-uniformity.

To attain the above object, in a first aspect of the present invention, there is provided an exposure mask for use in step exposure of a pattern to be formed on a TFT substrate, the exposure mask having pattern-forming portions each formed with a pattern portion for one pixel and shield portions each for blocking transmission of exposure light for one pixel. This exposure mask is characterized in that in an area corresponding to an overlapping exposure area in the step exposure, a plurality of the pattern-forming portions and a plurality of the shield portions are mosaically arranged, such that areas between one shield portions and other shield portions vertically or laterally adjacent to the one shield portions are shielded.

Further, to attain the above object, in a second aspect of the present invention, there is provided a method of exposing a pattern to be formed on a TFT substrate by step exposure using an exposure mask having pattern-forming portions each formed with a pattern portion for one pixel and a plurality of shield portions each for blocking transmission of exposure light for one pixel.

This pattern exposure method is characterized by comprising a first exposure step of exposing a first pattern using a mask pattern in which a plurality of the pattern-forming portions and a plurality of the shield portions are mosaically arranged at opposite end portions thereof, such that areas between one shield portions and other shield portions vertically or laterally adjacent to the one shield portions are shielded, and a second exposure step of exposing a second pattern using the exposure mask, such that an end of the second pattern to be formed in adjacent to the first pattern and an end of the first pattern overlap each other.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1A and 1B are plan views schematically showing essential portions of an exposure mask according to a first embodiment of the present invention, in which:

FIG. 1A shows a mask pattern formed in a one-end portion of the exposure mask; and FIG. 1B shows a mask pattern formed in the other-end portion;

FIGS. 7A and 7B are plan views schematically showing essential portions of a conventional exposure mask, in which:

FIG. 7A shows a mask pattern formed in a one-end portion of the exposure mask; and FIG. 7B shows a mask pattern formed in the other-end portion.

DESCRIPTION OF THE PREFERRED EMBODIMENTS

Hereafter, preferred embodiments of the present invention will be described with reference to the drawings.

First, a description will be given of a first embodiment of the present invention.

Figure 1A:
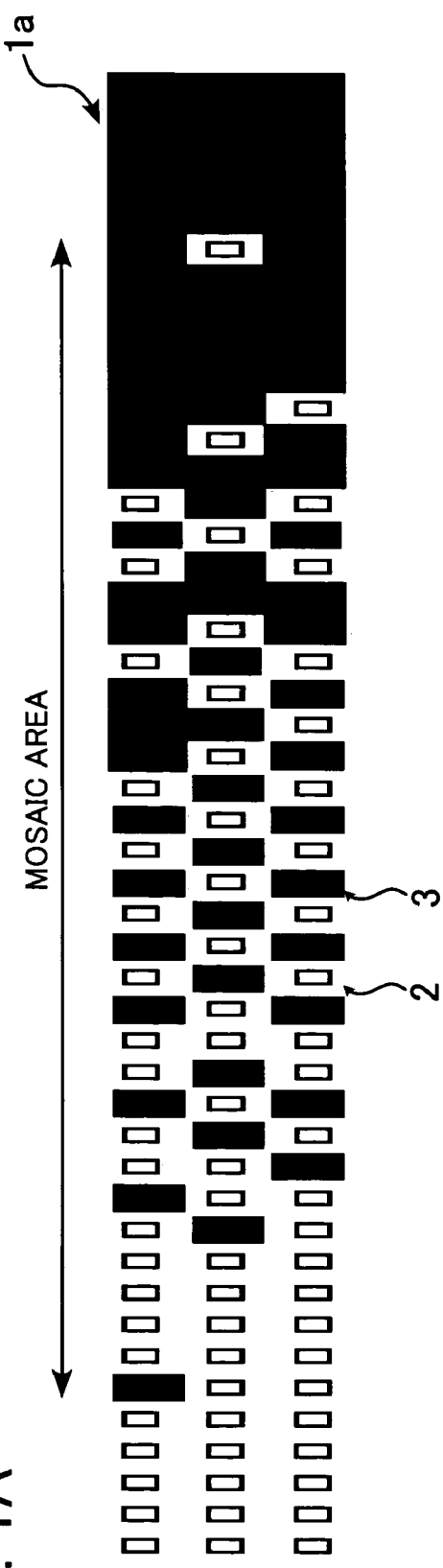
Figure 1B:
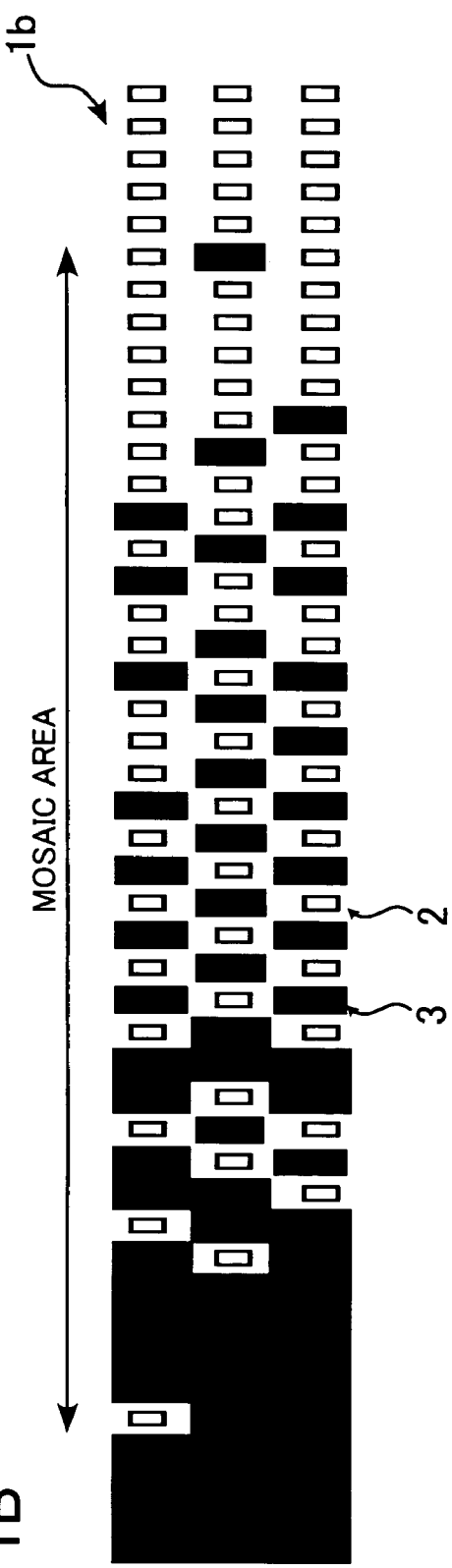
Figure 2:
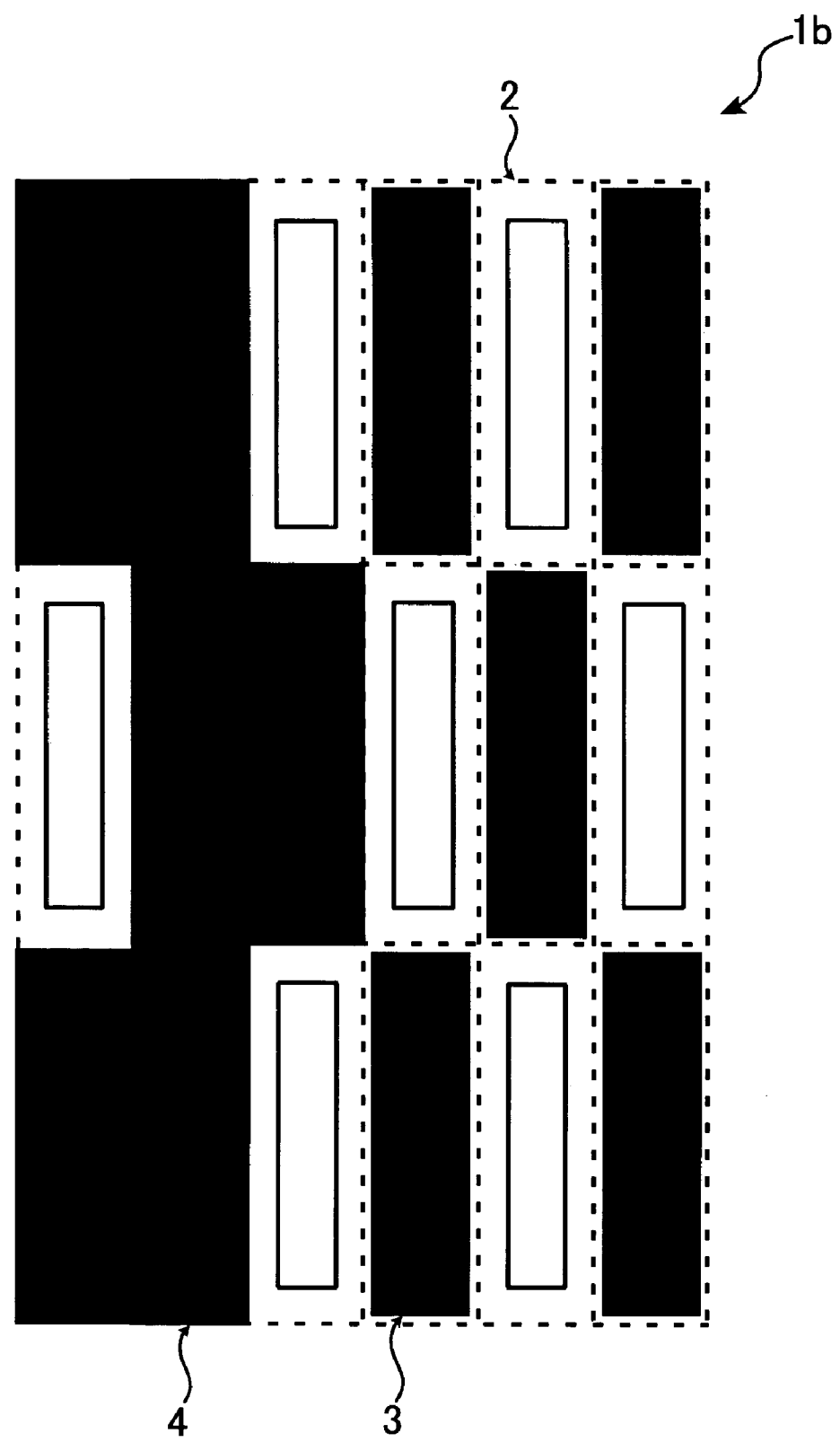
FIG. 2 is a view showing a portion of FIG. 1B on an enlarged scale.

FIGS. 1A and 1B are plan views schematically showing essential portions of an exposure mask according to the first embodiment. FIG. 1A shows a mask pattern formed in a one-end portion of the exposure mask, and FIG. 1B shows a mask pattern formed in the other-end portion of the same. In FIG. 1A, the right-side end, as viewed in the figure, corresponds to an end of the exposure mask, while in FIG. 1B, the left-side end, as viewed in the figure, corresponds to an end of the exposure mask. FIG. 2 shows a portion of FIG. 1B on an enlarged scale.

The mask patterns formed on the exposure mask according to the first embodiment are for use in forming a pattern of numerous traces of pixel wiring and pixel electrodes on a TFT substrate by step exposure. The wiring formed on the TFT substrate by using this kind of exposure mask includes drain bus (DB) lines and gate bus (GB) lines, for example. These lines are formed by patterning a metal layer formed e.g. of Cr, Mo, or Ti on the substrate, by step exposure. On the other hand, the pixel electrodes are formed by patterning a conductive film layer formed e.g. of ITO (Indium Tin Oxide) on the substrate, by step exposure.

Each of the mask patterns 1*a* and 1*b* shown in FIGS. 1A and 1B and FIG. 2 has an arrangement of plurality of pattern-forming portions 2 each formed with traces of wiring and pixel electrodes to be formed for one pixel by step exposure. Further, on the mask patterns 1*a* and 1*b*, there are arranged a plurality of shield portions 3 each for blocking transmission of exposure light for one pixel. The pattern-forming portions 2 and the shield portions 3 are mosaically arranged on the exposure mask to prevent occurrence of display non-uniformity.

The layout of the pattern-forming portions 2 and the shield portions 3 in the mosaic area of the mask pattern 1*a* in the one-end portion of the exposure mask is exactly reverse to the layout of those in the mosaic area of the mask pattern 1*b* in the other-end portion of the exposure mask. In short, the exposure mask has the mask patterns 1a and 1b formed in the respective opposite end portions such that they are complementary to each other. Further, in the mosaic area having the pattern-forming portions 2 and the shield portions 3 arranged mosaically, the shield portions 3 are arranged such that the number thereof is progressively reduced toward the center of the mask patterns 1a and 1b.

The shield portions 3 of the exposure mask are formed of a shielding material, such as Cr. Further, some of the shield portions 3 are formed to have a slightly smaller size than the pattern-forming portion 2 so as to prevent occurrence of non-exposure in some areas due to positional deviation of an exposure area during a shot. Further, in the exposure mask according to the first embodiment, the shielding material is also provided between shield portions 3 vertically or laterally adjacent to each other, whereby the shield portions in such a positional relationship each form a shield portion 4 corresponding to one pixel, which is larger than the shield portion 3, as shown in FIG. 2, so that the shield portions 4 adjacent to each other become continuous to form a larger shield area. This disposes, in a practical sense, one large shield portion for blocking transmission of exposure light for an area corresponding to a plurality of pixels adjacent to each other, in the exposure mask. In other words, when some of the shield portions in the mask, each of which corresponds to one pixel, are vertically or laterally adjacent to each other, there are two types of shield portions, large ones and small ones, each corresponding to one pixel.

The step exposure is carried out using the exposure mask formed as above, such that an end portion of a step-exposure pattern formed on the substrate by a preceding shot and an end portion of a step-exposure pattern formed on the substrate by a following shot overlap each other. As a result, in the joint area (overlapping exposure area) of the step-exposure patterns formed on the substrate, areas shielded during the preceding shot are exposed during the following shot, and areas exposed during the preceding shot are shielded during the following shot, whereby the whole joint area is exposed.

In the step exposure, the shield portions 4 of the mask patterns 1a and 1b adjacent to each other are formed in a manner continuous with each other without a gap therebetween, so that a pattern of corresponding adjacent pixel areas exposed during the preceding shot is effectively shielded during the following shot. Conventionally, light leaked through a gap between adjacent shield portions caused overexposure of a portion of each of the corresponding adjacent pixel areas close to a border area thereof. According to the first embodiment, however, the exposure mask prevents the portion from being directly irradiated with exposure light.

In the exposure mask according to the first embodiment, there is no gap formed between shield portions adjacent to each other as described above. This makes it possible to considerably reduce light that leaks through the mosaic area during an shot, thereby preventing once exposed areas from being overexposed by leaked light. This suppresses variation in line width in which the line width of traces of a pattern formed on the TFT substrate becomes smaller than the design line width, and therefore makes it possible to accurately form the fine traces of DB and GB lines and pixel electrodes, thereby contributing to reduction of display non-uniformity of a liquid crystal display device.

Further, since some of the shield portions 3 are slightly smaller in size than the pattern-forming portion 2, even if positional deviation of the exposure area occurs during a shot, it is possible to prevent occurrence of areas not subjected to exposure, whereby occurrence of display non-uniformity can be prevented. Moreover, since the mosaic area of the exposure mask is formed such that the number of the shield portions 3 is progressively reduced toward the center of the mask patterns 1a and 1b, conspicuous difference in brightness hardly appears, so that occurrence of display non-uniformity can be prevented more effectively.

Next, a description will be given of a second embodiment of the present invention.

Figure 3:
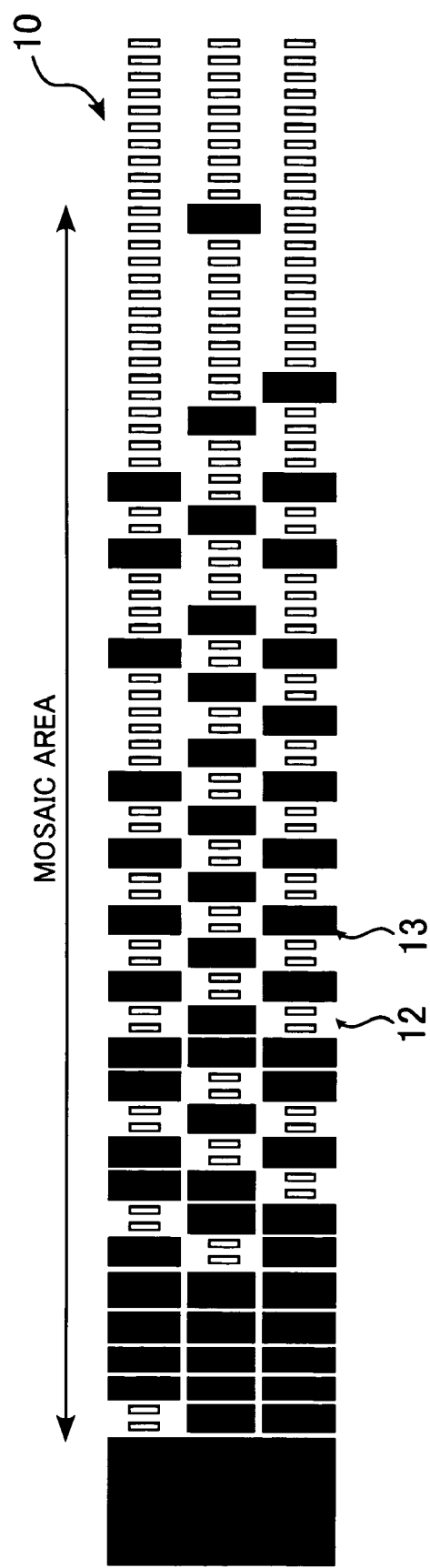
FIG. 3 is a plan view schematically showing an essential portion of an exposure mask according to a second embodiment of the present invention.

FIG. 3 is a plan view schematically showing an essential portion of an exposure mask according to the second embodiment. FIG. 3 shows a mask pattern formed in a one-end portion of the exposure mask. In FIG. 3, the left-side end of the mask pattern corresponds to an end of the exposure mask.

In the mask pattern 10 of the exposure mask of the second embodiment, two pixels laterally adjacent to each other are treated as one unit, and pattern-forming portions 12 and shield portions 13 each formed for a pair of adjacent pixels are mosaically arranged on the mask pattern 10. More specifically, the pattern-forming portions 12 in the second embodiment are each formed by the unit of a pair of laterally adjacent individual pattern-forming portions each formed with traces of wiring and pixel electrodes for one pixel. Similarly, the shield portions 13 in the second embodiment are each formed by the unit of a pair of laterally adjacent individual shield portions each for blocking transmission of exposure light for one pixel. Therefore, an area of the shield portion 13 corresponding to an area between two pixels is formed with no gap.

Similarly to the first embodiment, the pattern-forming portions 12 and the shield portions 13 are arranged in the opposite end portions of the exposure mask in a complementary relationship. Further, in the mask pattern 10 of the second embodiment, each of the shield portions 13 is formed to have a slightly smaller size than the pattern-forming portion 12, and the shield portions 13 are arranged such that the number thereof is progressively reduced toward the center of the mask pattern 10.

The mosaic area in the end portion of the exposure mask is formed by laying out the pattern-forming portions 12 and the shield portions 13 each corresponding to two adjacent pixels, as described above, whereby the influence of light leaked during step exposure can be reduced. As a result, overexposure is suppressed, variation in pattern line width is reduced, and occurrence of display non-uniformity is prevented.

Figure 4:
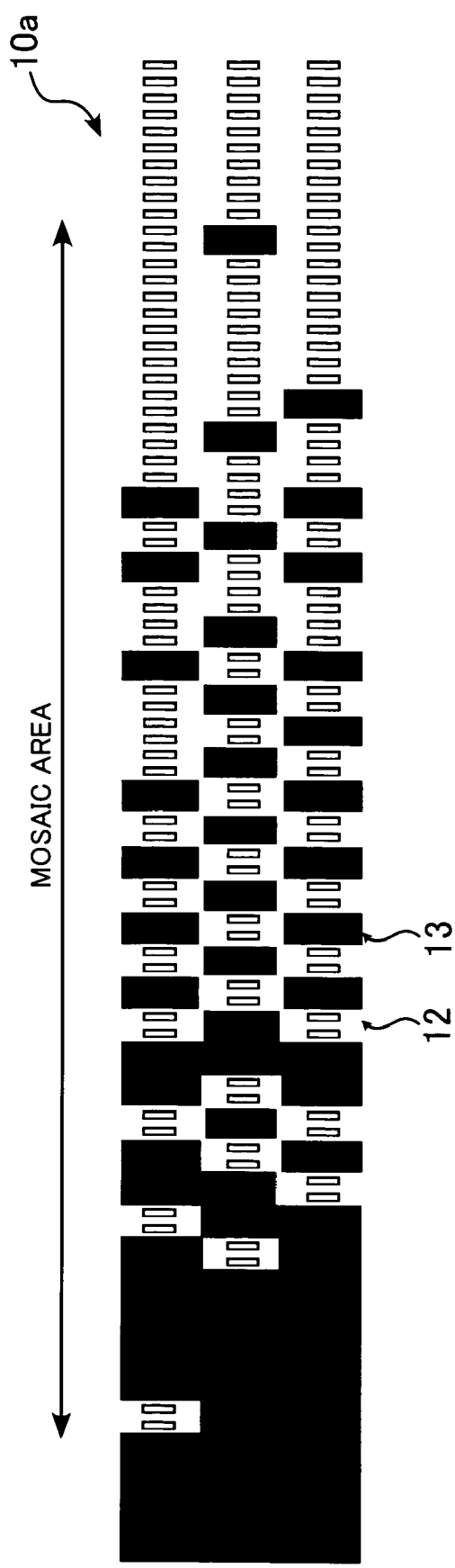
FIG. 4 is a plan view schematically showing another configuration of the exposure mask.
Figure 5:
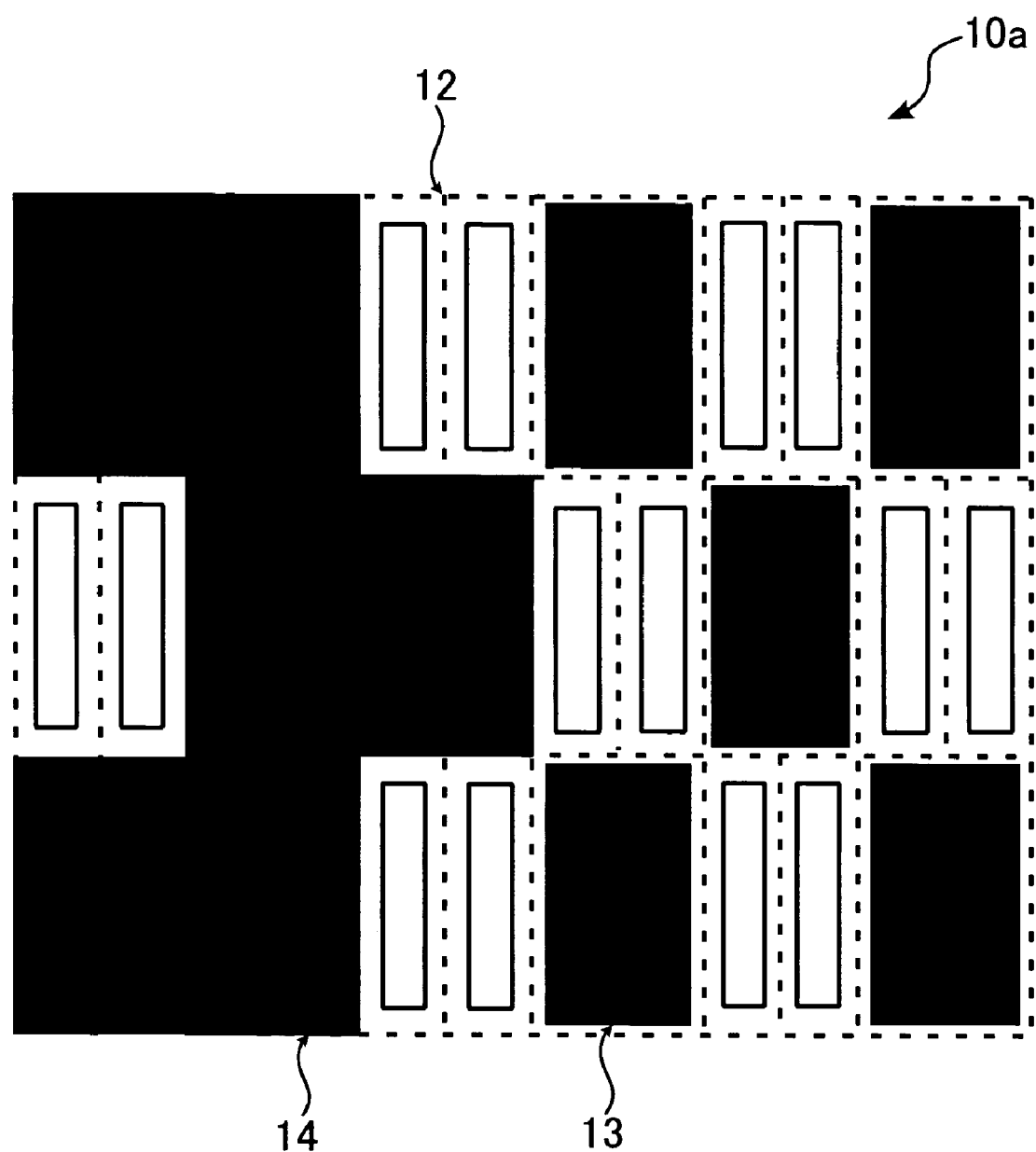
FIG. 5 is a view showing a portion of FIG. 4 on an enlarged scale.
Figure 6:
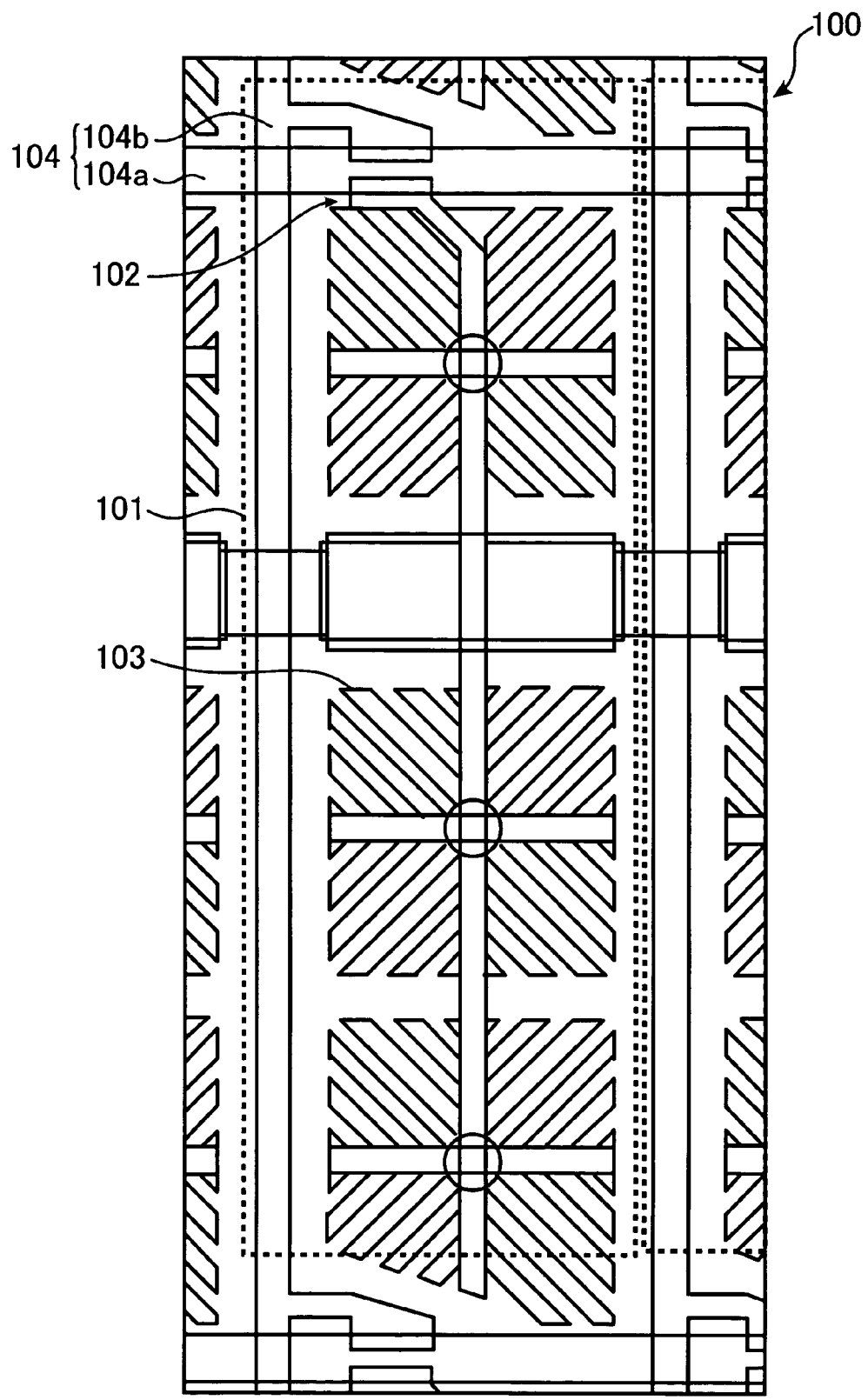
FIG. 6 is a plan view schematically showing an example of an essential portion of a TFT substrate.
Figure 7A:
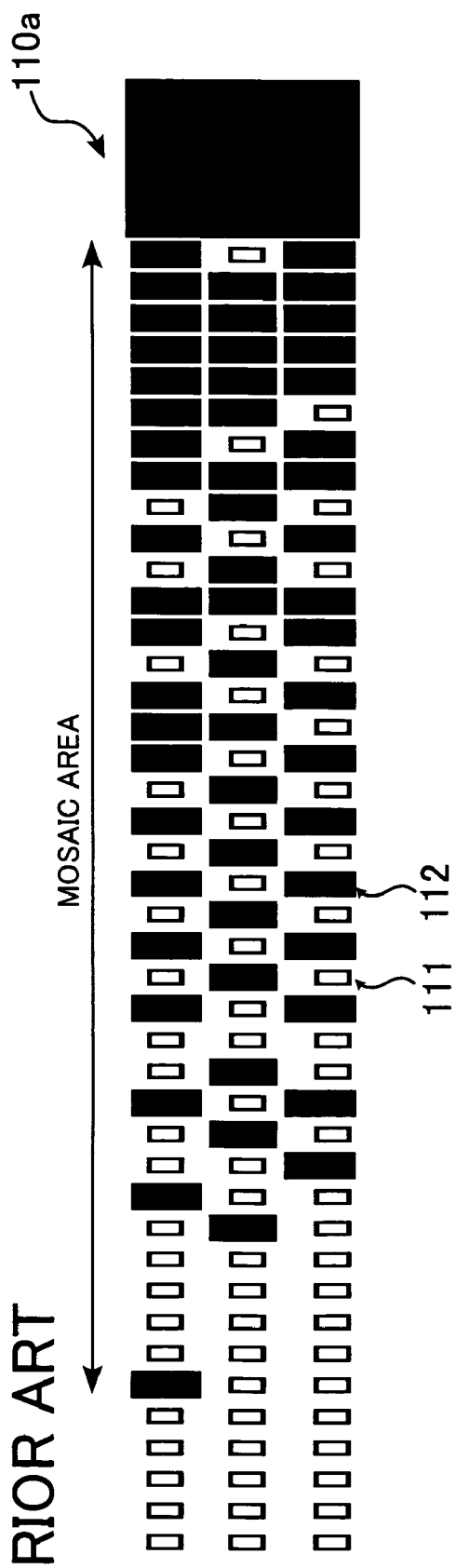
Figure 7B:
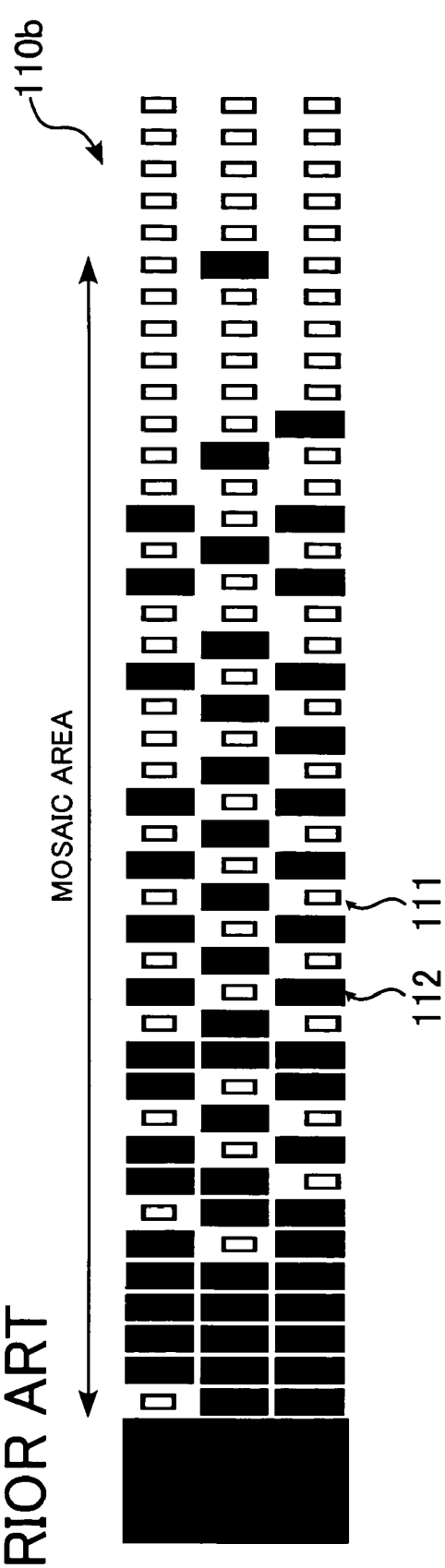
Figure 8:
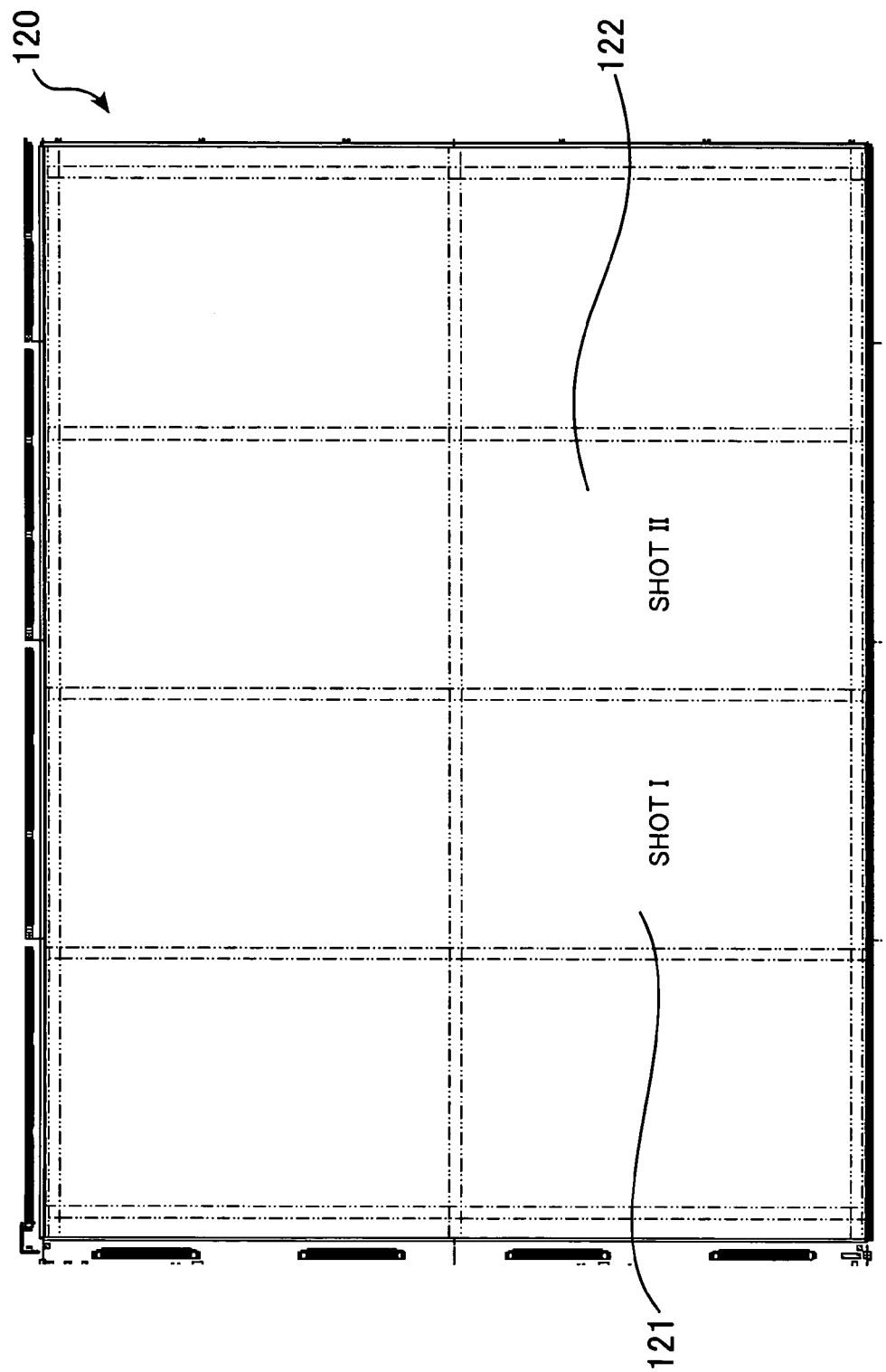
FIG. 8 is a view useful in explaining step exposure.

When the pattern-forming portions and the shield portions each corresponding to two adjacent pixels are arranged as described above, larger shield areas may be formed in which vertically or laterally adjacent shield portions become continuous with each other, as in the first embodiment. FIG. 4 is a plan view schematically showing another configuration of an essential portion of the exposure mask, thus formed. FIG. 5 is a view showing a portion of FIG. 4 on an enlarged scale. It should be noted that in FIGS. 4 and 5, component elements identical to or equivalent to those shown in FIG. 3 are designated by identical reference numerals, and detailed description thereof is omitted. In the mask pattern 10a shown in FIGS. 4 and 5, the pattern-forming portions 12 and the shield portions 13 each corresponding to two pixels are arranged mosaically, and each two of the vertically or laterally adjacent shield portions 13 have a gap therebetween filled up such that the adjacent shield portions 13 become continuous to form a larger shield portion 14 extending vertically or laterally. With this arrangement, the adjacent shield portions 14 have no gap formed therebetween, and hence light leaked through the mosaic area is further reduced, which makes it possible to suppress overexposure by leaked light, thereby preventing variation in pattern line width and occurrence of display non-uniformity.

It should be noted that although in the second embodiment, two pixels form a unit, the same advantageous effect can be obtained by treating three or more pixels laterally adjacent to each other as a unit.

As described above, the gaps between the adjacent shield portions of the exposure mask for use in step exposure are reduced, so that light conventionally leaked during a shot can be reduced. This makes it possible to suppress overexposure of once exposed areas by leaked light, thereby preventing variation in the line width of a pattern formed on a TFT substrate, and accurately forming the fine pattern of wiring and pixel electrodes. As a result, difference in brightness occurring in a joint area between step-exposure patterns is reduced, whereby occurrence of display non-uniformity is prevented, so that it is possible to efficiently manufacture a large-sized and high-quality TFT substrate, and hence a liquid crystal display device having the TFT substrate installed thereon.

It should be noted that although the above description is given only of the joint area between step-exposure patterns laterally adjacent to each other, a joint area between step-exposure patterns vertically adjacent to each other can be similarly described. The exposure mask described above has mosaic areas in the end portions thereof opposite to each other in the vertical direction, which are formed similarly to the above-described mosaic areas, and the step exposure is carried out such that the end portions of two vertically adjacent step-exposure patterns overlap each other.

As described above, according to the present invention, in the exposure mask having a plurality of pattern-forming portions and shield portions arranged mosaically, the areas between the vertically or laterally adjacent shield portions are shielded. This makes it possible to reduce light leaked through the mosaic areas of the exposure mask, and suppress variation in the line width of a pattern formed on a TFT substrate, whereby large-sized and high-quality liquid crystal display devices reduced in display non-uniformity can be efficiently manufactured.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An exposure mask for use in step exposure of a pattern to be formed on a TFT substrate, the exposure mask having pattern-forming portions each formed with a pattern portion for one pixel and shield portions each for blocking transmission of exposure light for one pixel,
   wherein in a joint area corresponding to an overlapping exposure area in the step exposure, a first end portion is formed in which a plurality of the pattern-forming portions and a plurality of the shield portions, each formed with a pattern portion for one pixel, are mosaically arranged with an area proportion changing along with the joint area, and a second end portion is formed opposite and complementary to the first end portion in which the area proportion changes along with the joint area,
   the shield portions including between the pattern-forming portions first shield portions smaller than the pattern-forming portions and second shield portions adjacent to each other and equal in size to the pattern-forming portions.

2. The exposure mask according to claim 1, wherein the pattern-forming portions and the shield portions are arranged mosaically, in respective units of two or more adjacent pattern-forming portions and two or more adjacent shield portions identical in number to a number of pattern-forming portions of one unit.

3. The exposure mask according to claim 1, wherein the shield portions are arranged such that the shield portions are progressively reduced in number toward a center of the exposure mask.

4. A pattern exposure method by way of exposing a pattern to be formed on a TFT substrate by step-exposure using an exposure mask a plurality of times, the method comprising:
   a first exposure step of exposing a first pattern using a mask,
   a second exposure step of exposing a second pattern using the exposure mask, such that an end of the second pattern to be formed in adjacent to the first pattern and an end of the first pattern overlap each other,
   the exposure mask including pattern-forming portions each formed with a pattern portion for one pixel and a plurality of shield portions each for blocking transmission of exposure light for one pixel,
   wherein in a joint area corresponding to an overlapping exposure area in the step exposure, a first end portion is formed in which a plurality of the pattern-forming portions and a plurality of the shield portions, each formed with a pattern portion for one pixel, are mosaically arranged with an area proportion changing along with the joint area, and a second end portion is formed opposite and complementary to the first end portion in which the area proportion changes along with the joint area,
   the shield portions including between the pattern-forming portions first shield portions that are smaller than the pattern-forming portions and second shield portions that are adjacent to each other and equal in size to the pattern-forming portions.

* * * * *